United States Patent
Marsh

(10) Patent No.: US 10,512,164 B2
(45) Date of Patent: Dec. 17, 2019

(54) MICRO DEVICES FORMED BY FLEX CIRCUIT SUBSTRATES

(71) Applicant: Encite LLC, Burlington, MA (US)

(72) Inventor: Stephen A. Marsh, Carlisle, MA (US)

(73) Assignee: Encite LLC, Burlington, MA (US)

( * ) Notice: Subject to any disclaimer, the term of this patent is extended or adjusted under 35 U.S.C. 154(b) by 0 days.

(21) Appl. No.: 16/143,677

(22) Filed: Sep. 27, 2018

(65) Prior Publication Data

US 2019/0104616 A1    Apr. 4, 2019

Related U.S. Application Data

(60) Provisional application No. 62/566,591, filed on Oct. 2, 2017.

(51) Int. Cl.
| | | |
|---|---|---|
| H05K 1/00 | (2006.01) | |
| H05K 1/18 | (2006.01) | |
| H05K 1/03 | (2006.01) | |
| B81C 1/00 | (2006.01) | |
| B81B 3/00 | (2006.01) | |
| G01P 15/125 | (2006.01) | |
| B81C 99/00 | (2010.01) | |

(52) U.S. Cl.
CPC ........... *H05K 1/189* (2013.01); *B81B 3/0021* (2013.01); *B81C 1/0015* (2013.01); *B81C 1/00166* (2013.01); *B81C 99/0095* (2013.01); *G01P 15/125* (2013.01); *H05K 1/0393* (2013.01); *B81B 2201/0235* (2013.01); *B81B 2201/0264* (2013.01); *B81B 2201/0292* (2013.01); *B81C 2201/019* (2013.01); *B81C 2203/038* (2013.01); *B81C 2203/051* (2013.01)

(58) Field of Classification Search
CPC .... B81B 2201/0235; B81B 2201/0292; B81B 3/0021; B81C 1/0015; B81C 1/00166; H05K 1/0393; H05K 1/189
See application file for complete search history.

(56) References Cited

U.S. PATENT DOCUMENTS

| | | | | |
|---|---|---|---|---|
| 4,987,779 | A * | 1/1991 | McBrien | G01P 15/125 73/514.18 |
| 5,101,669 | A * | 4/1992 | Holm-Kennedy | G01P 15/0802 361/278 |
| 6,744,173 | B2 * | 6/2004 | Behin | B81B 3/0021 310/309 |
| 8,319,312 | B2 | 11/2012 | Morris, III et al. | |
| 9,650,239 | B2 * | 5/2017 | Chu | B81C 1/00309 |
| 2003/0060051 | A1 | 3/2003 | Kretschmann et al. | |

(Continued)

FOREIGN PATENT DOCUMENTS

WO    WO2016/112463    7/2016

OTHER PUBLICATIONS

International Search Report and Written Opinion, PCT/US18/53691, dated Feb. 5, 2019, 15 pgs.

*Primary Examiner* — Yuriy Semenenko
(74) *Attorney, Agent, or Firm* — Fish & Richardson P.C.

(57) ABSTRACT

Disclosed is a flexible electronic circuit substrate that includes a device that is fabricated from layers of the flexible electronic circuit substrate as part of construction of the flexible electronic circuit substrate. Such devices could be functional units such as micro electro mechanical devices (MEMS) devices such as micro-accelerometer sensor elements, micro flow sensors, micro pressure sensors, etc.

24 Claims, 14 Drawing Sheets

(56) References Cited

U.S. PATENT DOCUMENTS

| | | | |
|---|---|---|---|
| 2004/0027029 A1* | 2/2004 | Borwick, III | H02N 1/008 |
| | | | 310/309 |
| 2004/0121528 A1* | 6/2004 | Krulevitch | A61N 1/0452 |
| | | | 438/166 |
| 2005/0012975 A1* | 1/2005 | George | B81B 3/0005 |
| | | | 438/48 |
| 2009/0139347 A1* | 6/2009 | Speldrich | G01F 1/363 |
| | | | 73/861.63 |
| 2011/0006383 A1* | 1/2011 | Shimoyama | B81B 7/04 |
| | | | 257/417 |
| 2014/0264662 A1 | 9/2014 | Cheng et al. | |
| 2016/0060104 A1* | 3/2016 | Chu | B81C 1/00309 |
| | | | 257/416 |
| 2017/0227570 A1* | 8/2017 | Chatterjee | G01P 15/125 |

* cited by examiner

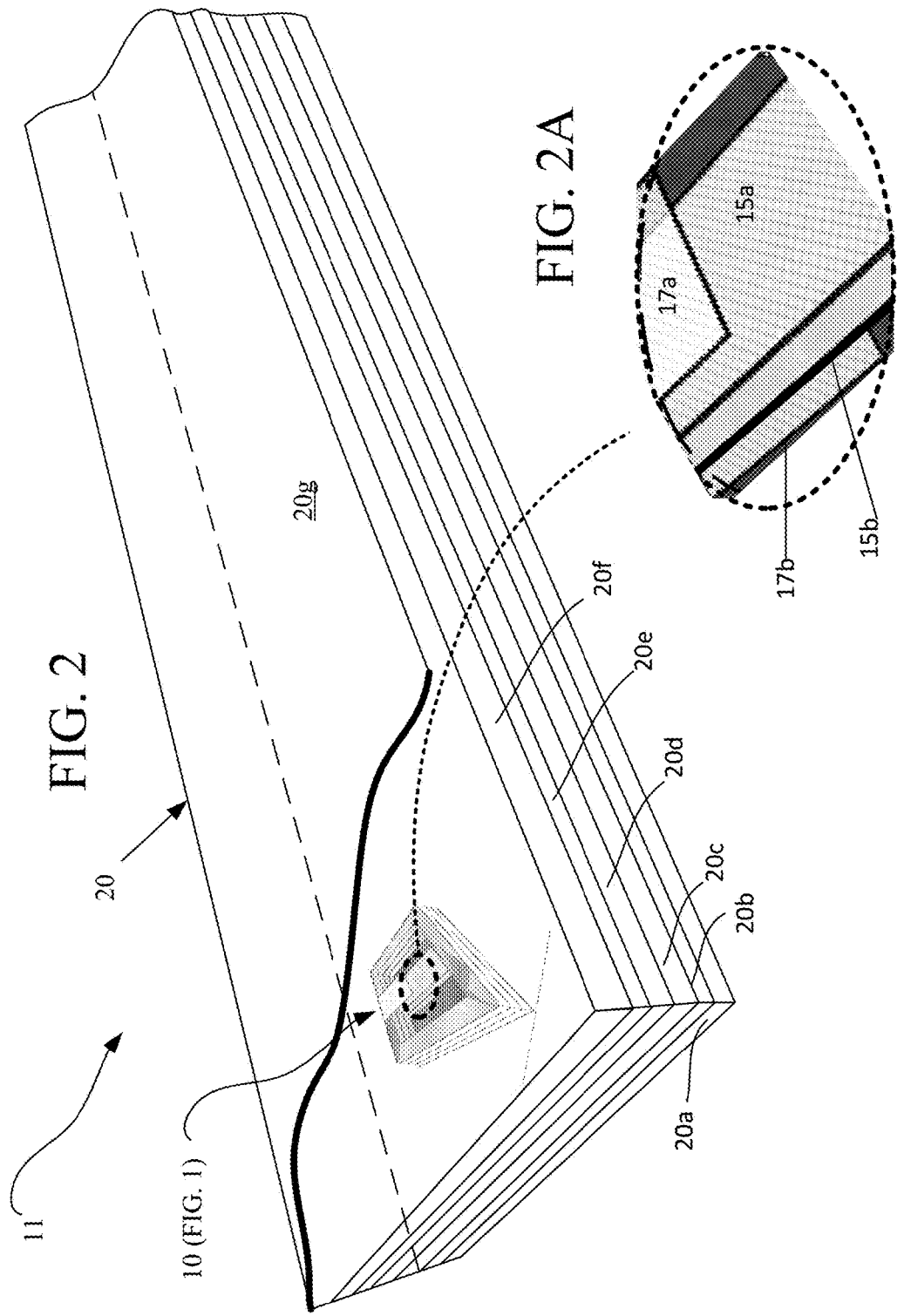

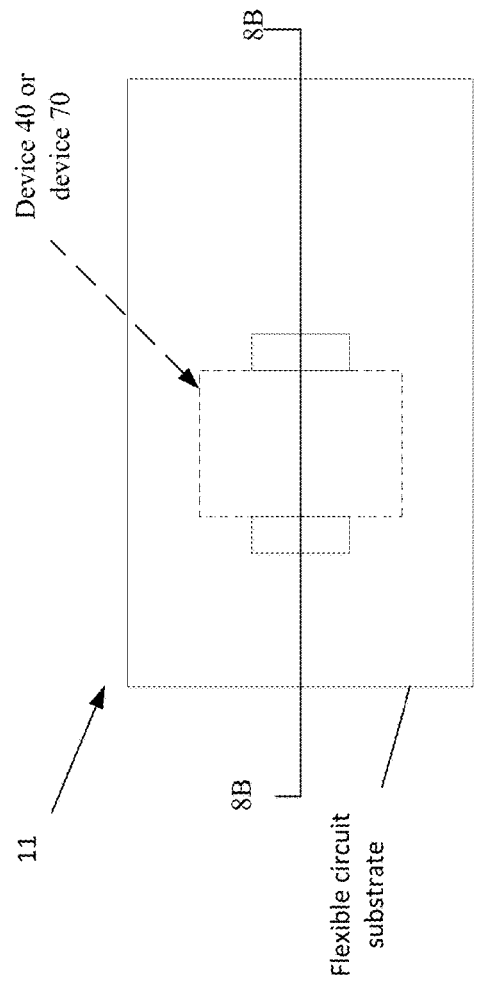
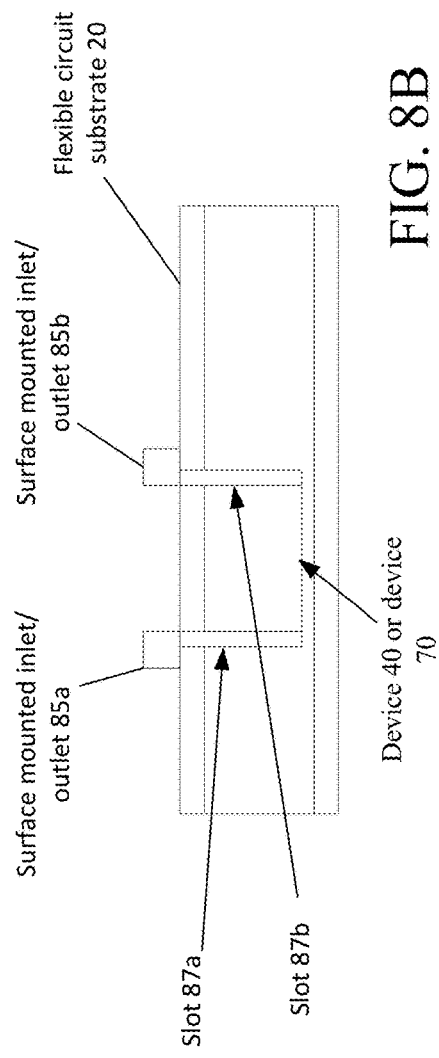

MICRO DEVICES FORMED BY FLEX CIRCUIT SUBSTRATES

This application claims priority under 35 U.S.C. § 119 to U.S. Provisional Patent Application Ser. No. 62/566,591, filed Oct. 2, 2017, and entitled "Micro Devices Formed by Flex Circuit Substrates", the entire contents of which is hereby incorporated by reference.

BACKGROUND

This specification relates to flexible circuitry and micro devices, such as accelerometers.

Flex (or flexible) circuit technology is an approach for manufacturing electronic circuits by mounting electronic components on flexible plastic substrates. Various types of plastic materials can be uses such as polyimide. Other materials such as Polyether ether ketone (PEEK), PET Polyethylene terephthalate, and transparent conductive polyester may be used. Flex circuit assemblies may be manufactured using identical components used for rigid printed circuit boards. However, unlike rigid printed circuit boards, flex circuit technology allows the flex circuit board to flex or conform to a shape during use.

Accelerometers are devices that measure "proper acceleration," i.e., the rate of change of velocity of a body in its own instantaneous rest frame in contrast to coordinate acceleration, being the acceleration in a fixed coordinate system. Accelerometers have multiple applications in industry and science. For instance, accelerometers are used in tablet computers, hand held smart phones, digital cameras and so forth so that images on screens are always displayed upright. Single axis as well as multi-axis accelerometers are available. Micro-machined accelerometer devices are present in many portable electronic devices such as hand-held controllers, e.g. remote controls and video game controllers and are used to provide a coarse indication of changes in device position, e.g., movement.

SUMMARY

Generally, micro-accelerometers used in applications are discrete device components that are typically mounted on or affixed on or to a circuit board or the like to provide a finished assembly. As a discrete device component, such accelerometers add fabrication cost in producing devices that use an accelerometer. While the incremental cost of adding a discrete device components accelerometers may be a fraction of the total cost of the finished assembly, in some applications such as the consumer applications mentioned above minimizing such costs is desirable. This problem can be extended to other types of micro electro-mechanical components that are fabricated as discrete components adding incremental costs, which costs for some applications of such devices can be significant.

According to an aspect, a circuit substrate includes a plurality of layers of one or more materials, with the plurality of layers adhered together, and with at least a first set of the plurality of layers having patterned electrical conductors thereon; and a micro electro mechanical device formed by a second set of the plurality of layers.

Some embodiments include at least some of the plurality of layers of the material are layers comprising one or more of a rigid or a semi-rigid or a flexible material, at least some of the plurality of layers of the material are layers comprising a flexible material, wherein at least some of the layers of the second set of the plurality of layers have metal conductors over portions thereof. Some embodiments include at least some of the second set of layers of the plurality of layers have a compartment and at least some other layers of the second set of layers of the plurality of layers each have a metal conductor supported on portions of the some other layers, at least some of the second set of layers of the plurality of layers of the flexible material have a compartment and at least one of the layers of the second set of the plurality of layers has a member integrally formed from the one layer, with the member being movable within the compartment.

Some embodiments include the second set of layers of the plurality of layers including a flexible material and the device is a micro-accelerometer sensor element. The micro-accelerometer sensor element further comprises a first electrode supported on a first layer of the second set of layers of the plurality of layers, a first spacer layer having a first compartment, the first spacer layer provided from a second layer of the second set of layers of the plurality of layers, a cantilever beam provided from a third layer of the second set of layers of the plurality of layers, the cantilever beam carrying a cantilever beam electrode, a second spacer layer having a second compartment, the second spacer layer provided from a fourth layer of the second set of layers of the plurality of layers, and a second electrode supported on a fifth layer of the second set of layers of the plurality of layers, with the cantilever beam electrode being disposed in a vertical alignment between the first and second compartments, and between portions of the first and second electrodes.

The flexible circuit further includes a capacitance measurement circuit having a first pair of inputs coupled to the first electrode and the beam electrode and a second pair of inputs coupled to the second electrode and the beam electrode, and a controller that converts measured capacitance from the capacitance measurement circuit into a measure of acceleration. The second set of the plurality of layers of the material are layers comprising a flexible material, and the device is a micro flow sensor, with a subset of the second set of the plurality of layers of the flexible material having one or more compartments formed in portions of the subset of the second set of the plurality of layers of the flexible material and with a rotatable wheel provided from a first layer of the subset of the second set of the plurality of layers of the flexible material and supported within the compartment between second and third layers of the subset of the second set of the plurality of layers of the flexible material.

Some embodiments include the flexible circuit wherein the second set of the plurality of layers comprise a flexible material that support a membrane layer, the device is a micro pressure sensor, and with a subset of the second set layers having compartments in portions thereof, with portions of the membrane layers supported over the compartments, and with each compartment having either an input or an output port.

According to an aspect, a method includes forming of a flexible circuit substrate from a plurality of layers of one or more materials; and while forming the flexible circuit substrate, forming an operative, micro electro mechanical device within the flexible circuit substrate from a set of the layers of the plurality of layers of the one or more materials.

Some embodiments include patterning a metal layer on a first layer from the set of layers to provide an electrode, forming a compartment in a first layer from the set of layers patterning a metal layer on a first layer from the set of layers to provide a first electrode, forming from a second layer from the set of layers, a moveable member that is moveable within the compartment, and patterning a metal layer on a third layer from the set of layers to provide a second electrode. The first electrode is in vertical alignment with the second electrode and functionally associated with the member that moves within the compartment. The operative device is a micro-accelerometer sensor element and the member that moves is a beam. The operative device is a micro-flow sensor and the member that moves is a rotatable wheel. The operative, micro electro mechanical device is a micro pressure sensor, and the method further includes forming a plurality of repeatable layers, by patterning first layers to provide corresponding compartments, and patterning metal layers on a like number of membrane layers to provide patterned electrodes, with the electrodes on the membrane layers disposed over respective compartments in the first layers; and stacking the plurality of repeatable layers.

According to an aspect, a micro-accelerometer sensor element device formed within a flexible circuit substrate comprised of a plurality of layers of a flexible material, is formed by a process including patterning a metal layer that is on a first one of the plurality of layers of flexible material to provide a first electrode, patterning at least one metal layer that is on a second one of the plurality of layers of flexible material to provide a cantilever beam electrode, forming from the second one of the plurality of layers of flexible material, a compartment and a cantilever beam that supports the cantilever beam electrode, with the cantilever beam electrode having a portion thereof in a vertical alignment with a portion of the first electrode; and patterning a metal layer that is on a third one of the plurality of layers of flexible material to provide a second electrode, with the second electrode in vertical alignment with the first electrode and the cantilever beam electrode.

According to an aspect, a method of providing an operative device embedded within a flexible circuit substrate comprised of a plurality of layers of a flexible material, includes patterning a metal layer that is on a first one of the plurality of layers of flexible material to provide a first electrode, patterning at least one metal layer that is on a second one of the plurality of layers of flexible material to provide a cantilever beam electrode, forming from the second one of the plurality of layers of flexible material, a compartment and a cantilever beam that supports the cantilever beam electrode, with the cantilever beam electrode having a portion thereof in a vertical alignment with a portion of the first electrode, and patterning a metal layer that is on a third one of the plurality of layers of flexible material to provide a second electrode, with the second electrode in vertical alignment with the first electrode and the cantilever beam electrode.

Some embodiments include the operative device is a micro-accelerometer sensor element. The method further includes forming a first spacer layer between the first and second layers, and forming a second spacer layer between the second and third layers, and with the first and second spacer layers each having a compartment over which the respective first and second electrodes are supported.

The accelerometers described herein are fabricated using micro fabrication methods that allow the accelerometers to be produced within micro fabrication flexible circuit substrates, as part of the construction of the flexible circuits themselves, at a nominal (e.g., potentially insignificant) incremental cost that avoids much of the incremental costs associated with discrete accelerometer devices, e.g., the cost of the device, costs in mounting the device, and costs incurred by the discrete device occupying physical space on the flexible circuit.

The described accelerometers can sense changes in orientation for a variety of applications especially consumer applications. The accelerometers described below are fabricated using reasonably inexpensive techniques and thus provide inexpensive accelerometers built into such flexible circuit substrates. In particular embodiments, the accelerometers described below are fabricated using roll to roll manufacturing techniques.

The details of one or more embodiments of the invention are set forth in the accompanying drawings and the description below. Other features, objects, and advantages of the invention are apparent from the description and drawings, and from the claims.

DESCRIPTION OF DRAWINGS

FIG. 2 is an isometric view of a flexible circuit substrate having the accelerometer sensor element device of FIG. 1.

FIG. 2A is an isometric magnified view of a portion of the accelerometer sensor element device of FIG. 2.

FIGS. 8A and 8B are plan and cross-sectional views showing inlets and outlets or fluid couplings that are surface mounted on a flexible circuit substrate.

DETAILED DESCRIPTION

Overview

Micro-accelerometer sensor elements (micro-accelerometer sensor elements) are built into flexible layers of a flexible circuit (flex-circuit) are described herein and are made using micro fabrication methods. The micro-accelerometer sensor elements can be used for sensing changes in orientation or motion in various applications including consumer device applications. The micro-accelerometer sensor elements are fabricated on a micron/millimeter scale. Several fabrication techniques are disclosed. Also disclosed are other micro devices that are built into and fabricated from layers of flexible circuits. As used herein "layer" is generally used to refer to a portion of a flexible circuit, whereas "sheet" is used to refer to a bolt of material that is used in forming flexible circuit assemblies. However, use of layers or sheets would be acceptable and understood from context of the description.

Figure 1:
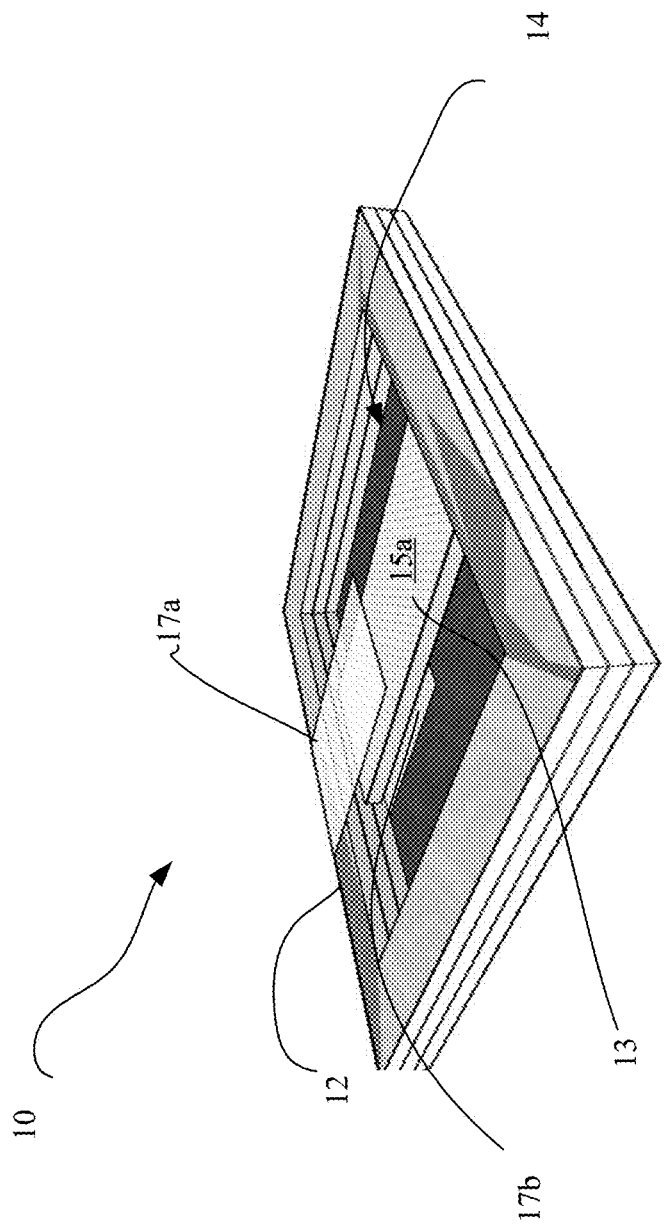
FIG. 1 is an isometric view of an accelerometer sensor element device that is shown in isolation, but which is built within a flexible circuit substrate from layers of the flexible circuit.

Referring to FIGS. 1 and 2, a micro-accelerometer sensor element 10 is fabricated as part of and during fabrication of a flex-circuit substrate 20 (FIG. 2). The micro-accelerometer sensor element 10 (shown in FIG. 1 in isolation but in FIG. 2 as integrally formed from the flex circuit substrate 20) includes a frame 12 that houses a cantilever beam 13 that acts as a reference or proofing mass. The frame 12 surrounds a compartment 14 within which the cantilever beam 13 extends. The cantilevered beam 13 is integrally formed as part of the frame 12. The cantilever beam 13 carries one or two electrodes, e.g., electrode 15a, as shown on a topside of the cantilever beam 13, and could carry an electrode on the bottom side (not shown). The cantilever beam 13 is suspended in the compartment 14 and between two electrodes 17a, 17b that extend from the frame 12.

Figure 9:
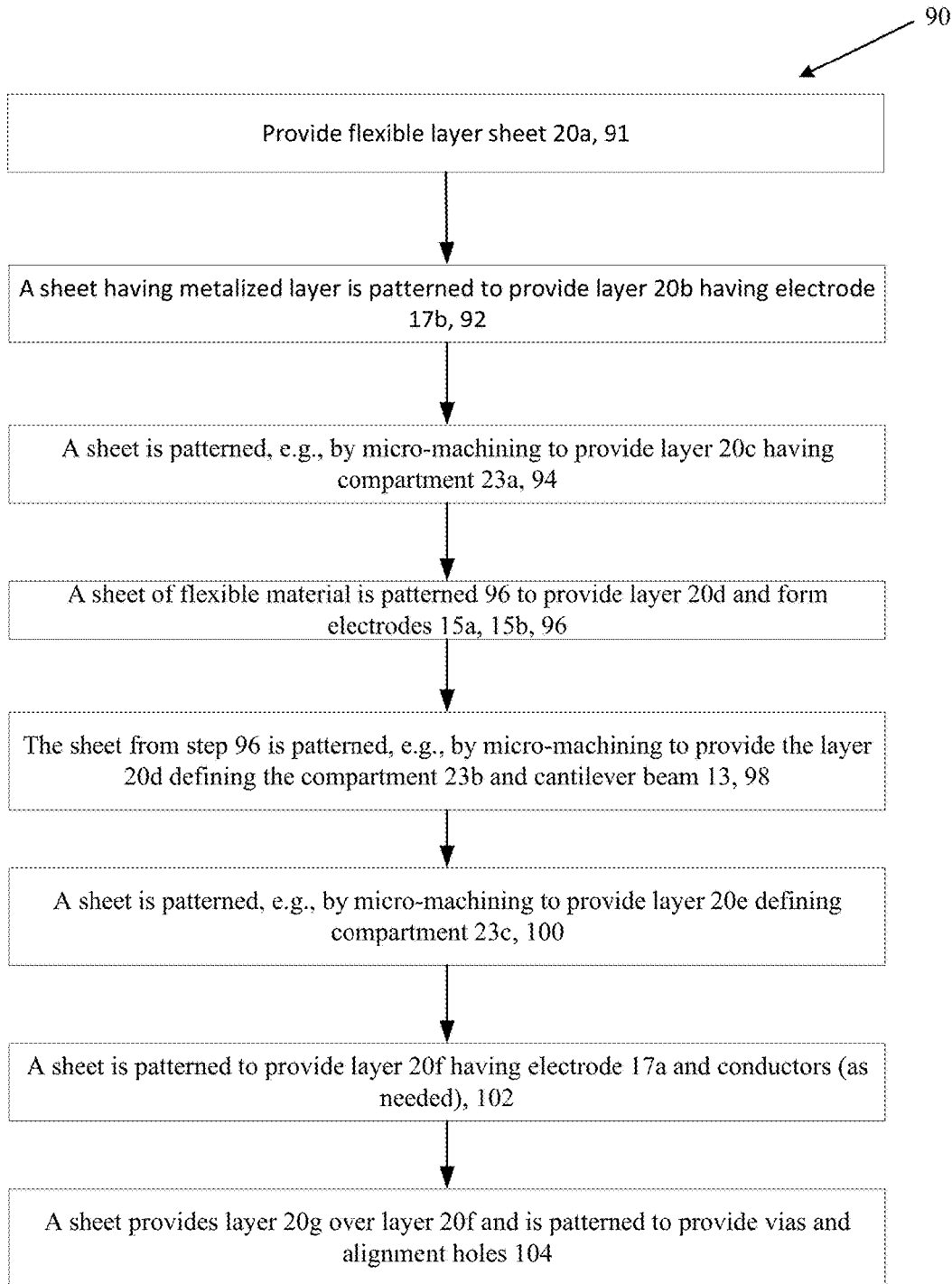
FIG. 9 depicts a flow diagram.

Referring to FIG. 2, the micro-accelerometer sensor element 10 is fabricated within the flexible circuit substrate 20 comprising flexible layers 20a-20g (provided from sheets of material(s) see FIG. 9), which provide a flexible circuit 11. In one implementation, the flexible circuit 11 is defined as the combination of plural flexible layers, including the layers 20a-20g, optionally other devices (not shown), and the micro-accelerometer sensor element 10. In another implementation, the flexible circuit 11 consists essentially of the combination of plural flexible layers, including the layers 20a-20g, other devices (not shown), and the micro-accelerometer sensor element 10. In still another implementation, the flexible circuit 11 consists of the combination of plural flexible layers, including the layers 20a-20g and the micro-accelerometer sensor element 10.

Typically, the layer 20a and the layer 20g serve as lower and upper boundary layers (e.g., caps) for the micro-accelerometer sensor element 10. The micro-accelerometer sensor element 10 is formed from a second layer 20b of the flexible circuit substrate 20, a third layer 20c, a fourth layer 20d, a fifth layer 20e, and sixth layer 20f, as illustrated in FIG. 2. Thus, the first layer 20a and the upper layer 20g of the flexible circuit substrate 20 contain or provide boundaries to the micro-accelerometer sensor element 10 within the flexible circuit substrate 20. More layers (not shown) can be provided above or below layers 20a and 20f, as the needs of the flexible circuit substrate 20 require. The upper layer 20g is shown partially broken away.

Although not explicitly illustrated in FIG. 2, some of the layers 20a-20g are actually two layers, a body layer from which a frame or body is defined and a metalized film layer. In some implementations, some of these layers 20a-20g can include a body layer and a membrane layer having a metalized film layer from which an electrode is defined. Also not explicitly illustrated in FIG. 2, in some implementations of the layer 20d the layer 20d is actually a composite layer of a body layer from which the cantilever beam 13 is defined, and which has two metalized surface film layers (not shown) from which the electrode 15a is defined.

The micro-accelerometer sensor element 10 is of a capacitive type that converts mechanical energy into an electrical signal(s). The details of techniques to construct the micro-accelerometer sensor element 10 and details of various configurations of micro-accelerometer sensor elements will be discussed below. Prior to that discussion, some principals of operation will be discussed first.

During application of an external acceleration, the proof mass which in FIG. 1 is the cantilever beam 13, deflects from a neutral position (e.g., a center position between electrodes 17a, 17b or an otherwise known equilibrium position). This deflection is measured by determining changes in capacitance between the set of fixed electrodes 17a, 17b and the electrode 15a on the cantilevered beam 13 (proof mass). The cantilevered beam 13 as the proof mass has a known quantity of mass. During the application of an external acceleration, the cantilever beam 13 deflects. This deflection is measured by changes in capacitance between two capacitors C1 and C2. One of the capacitors C1 is formed between the electrode 15a carried by the cantilevered beam 13 and fixed electrode 17a and the other capacitor C2 is formed between the electrode 15a carried by the cantilevered beam 13 and fixed electrode 17b (or if the cantilever beam 13 has an electrode 15b as shown in FIG. 2A, then between electrode 15b and electrode 17b). These changes in capacitance are used to detect changes in position, e.g., movements of the cantilever beam 13 and concomitant therewith detect an application of an external acceleration.

In some implementations, the compartment 14 is a sealed compartment that include a gas (e.g., air) that acts as a damping agent. In other embodiments, the compartment 14 is a sealed compartment at a near vacuum pressure or at least a reduced pressure.

Referring now to FIGS. 3A to 3D, the micro-accelerometer sensor element 10 is shown in various stages of construction.

Figure 3A:
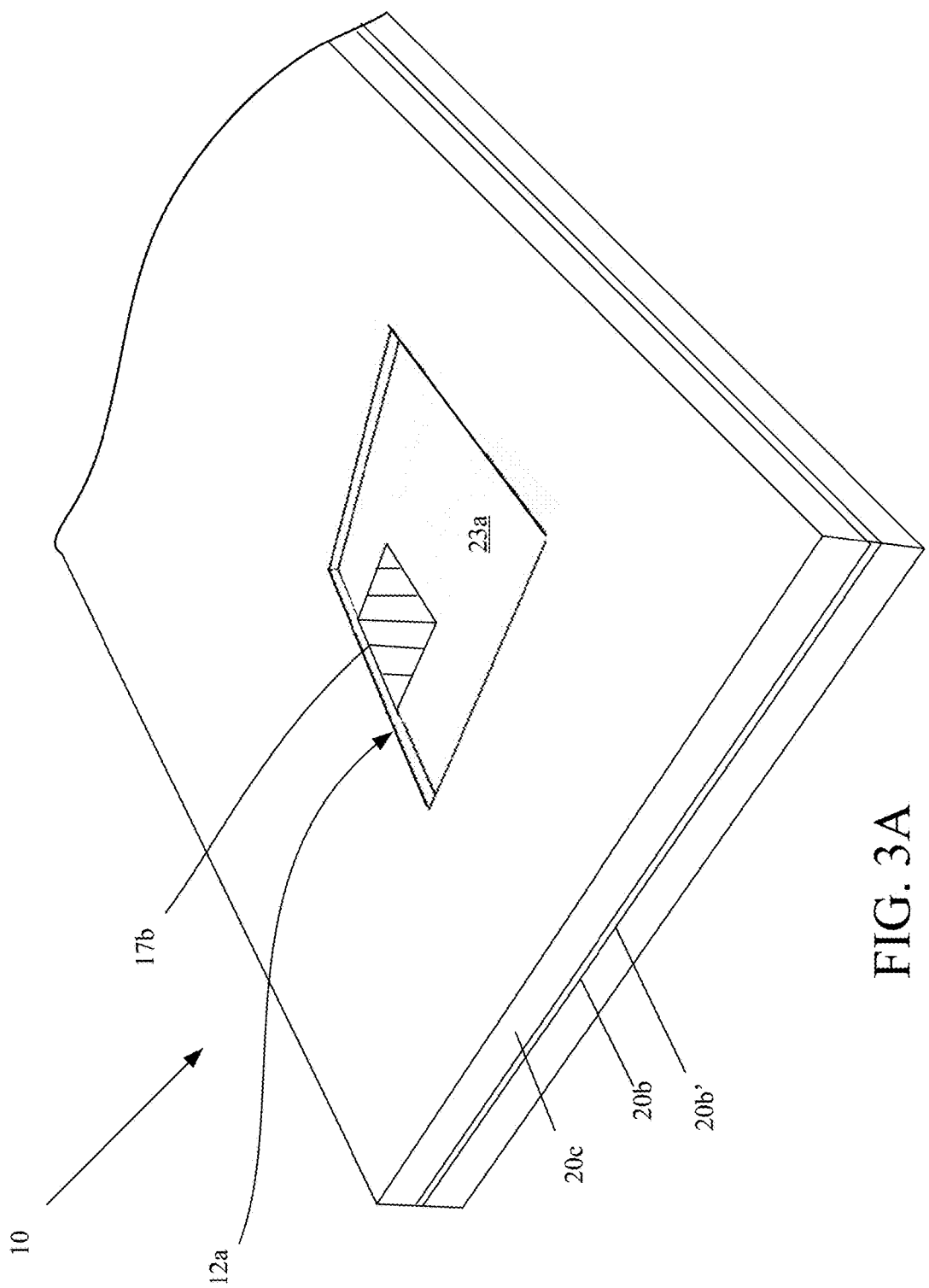
FIGS. 3A-3D are isometric views of the flexible circuit substrate in various stages of construction of the accelerometer sensor element device of FIG. 1 fabricated from layers of the flexible circuit substrate.

FIG. 3A shows the micro-accelerometer sensor element 10 of FIG. 1 (at a stage of construction). The micro-accelerometer sensor element 10 is formed from the second layer 20b and the third layer 20c of the flexible circuit substrate 20 at this stage of construction. The second layer 20b carries the electrode 17a and the third layer 20c is a spacer layer having a compartment 23a.

The second layer 20b is a layer of a flexible material having a metalized surface layer 20b' on a surface thereof from which the electrode 17b is patterned. In some implementations this electrode can be interconnected to other interconnects of the flexible circuit substrate 20. In some embodiments, the layer 20b can have a membrane layer (not shown) that has a metal layer over a first major surface thereof. The metal layer 20b' on the second layer 20b is patterned to provide the electrode 17b (and electrical interconnects (not shown) to that electrode 17b). (The metal layer 20b' is generally completely removed except on the electrode 17b and electrical interconnects).

The compartment 23a is formed in the third layer 20c also of the flexible material of the flexible circuit substrate 20, (here illustrated as immediately above the layer 20b). Not shown in FIG. 3A is the bottom layer 20a (FIG. 1). The third layer 20c defines a portion 12a of the frame 12 (FIG. 1) that has four walls (not referenced). The frame portion 12a defines a portion 23a of the compartment 14 (FIG. 1).

Figure 3B:
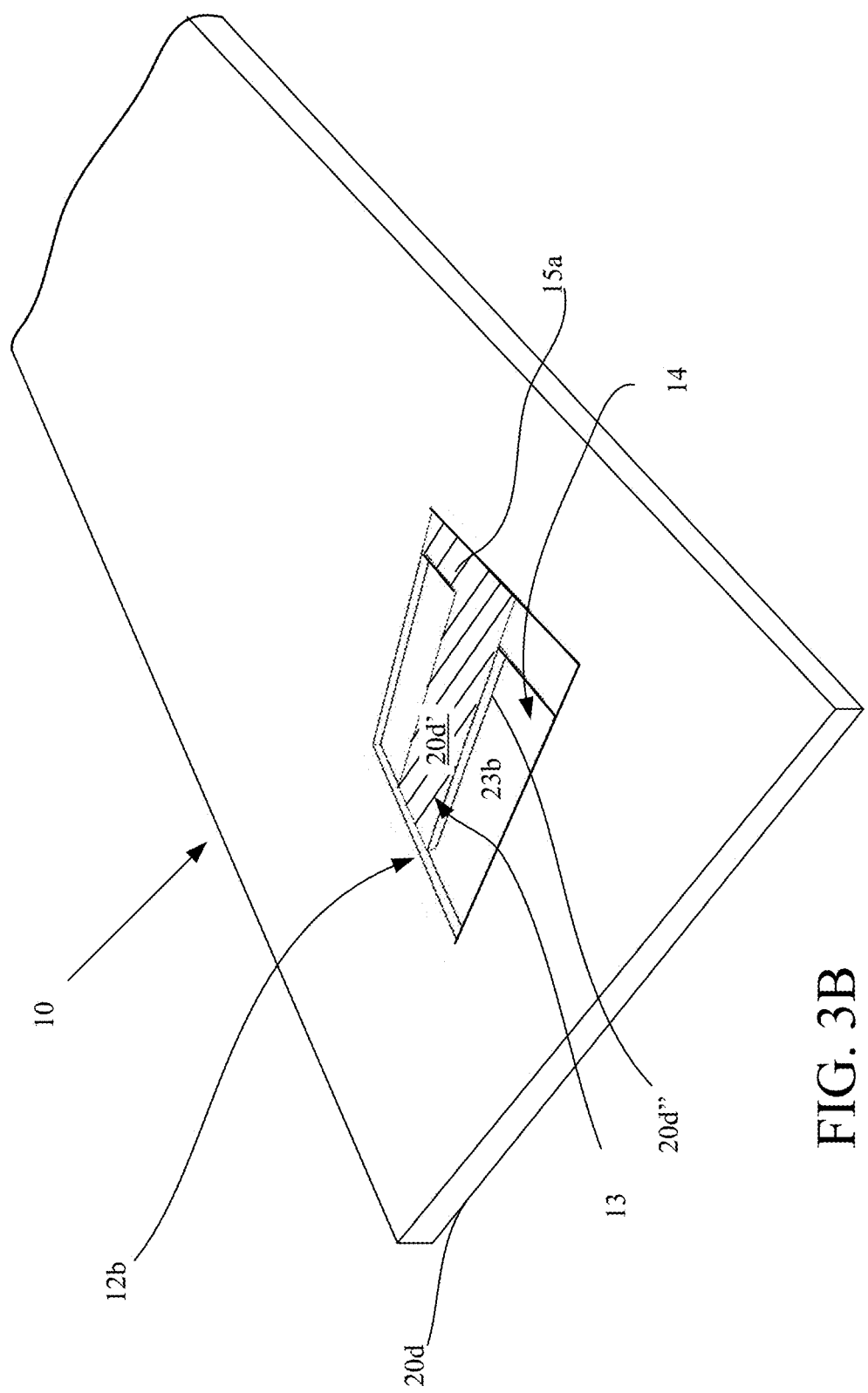

FIG. 3B shows the micro-accelerometer sensor element 10 (at a subsequent stage of construction) having a portion 12b of the frame 12 (FIG. 1) having four walls (not referenced). The frame portion 12b defines a compartment 23b. The fourth layer 20d of the flexible material is patterned to form the frame portion 12b, the compartment 23b, and the cantilever beam 13 having the electrode 15a. The fourth layer 20d of the flexible material carries at least one, but could carry two metal layers 20d', 20d" (to provide one or both electrodes 15a, 15b) over opposing surfaces of the cantilever beam 13 and conductors. The frame portion 12b, the compartment 23b, and the cantilever beam 13 features are formed by selective removal of portions of the fourth layer 20d and portions of the metal layers 20d' and/or 20d".

In FIG. 3B, all of the metal layers 20d', 20d" are shown as removed, except on the cantilever beam 13 and part of the frame portion 12b. Electrical conductors (not shown) can be patterned from portions of the metal layer 20d'.

Figure 3C:
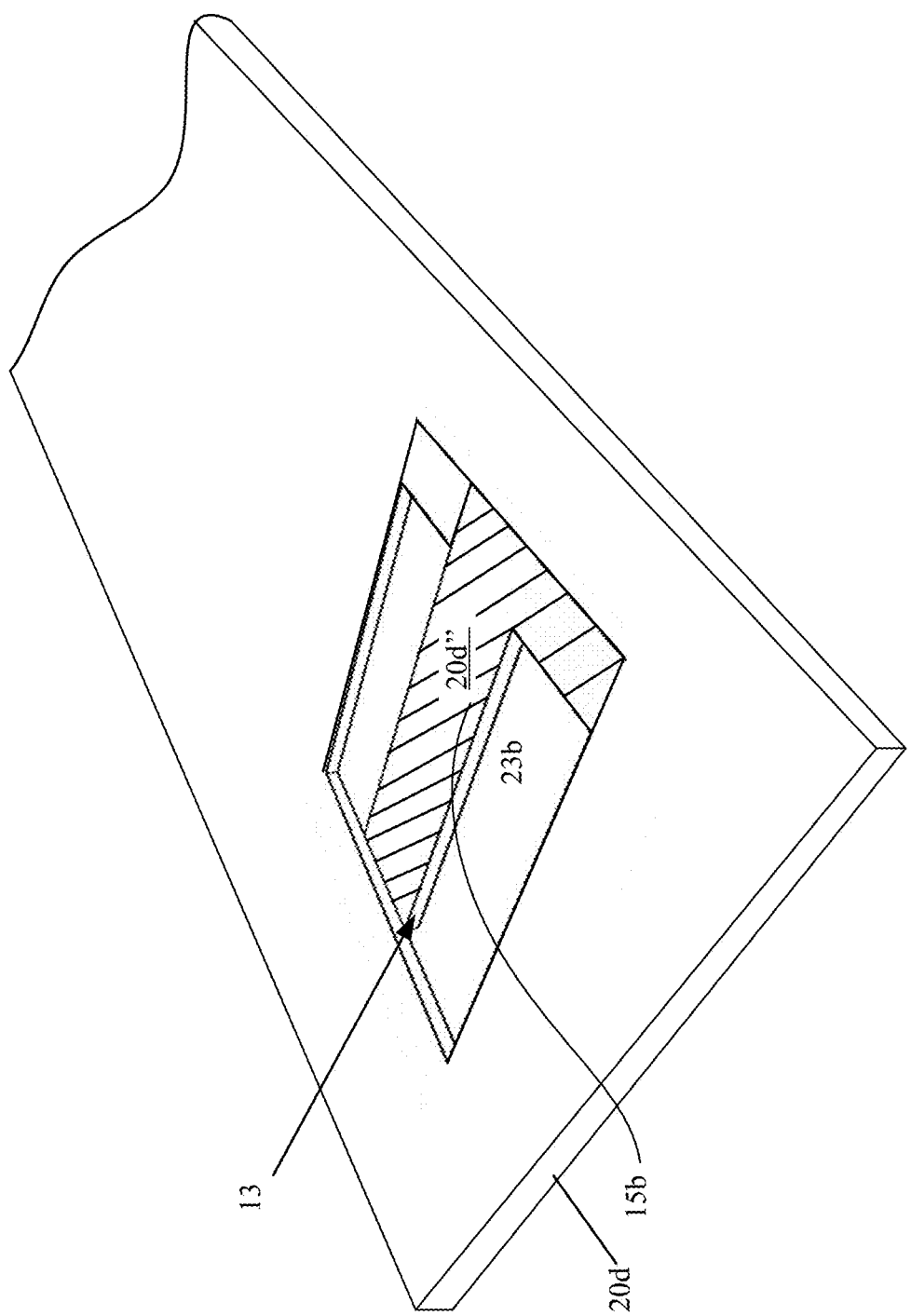

FIG. 3C shows the micro-accelerometer sensor element 10 (at the stage of construction of FIG. 3B) from an underside of the cantilever beam 13, formed as discussed above from layer 20d and metal layer 20d" patterned to provide the optional electrode 15b.

Figure 3D:
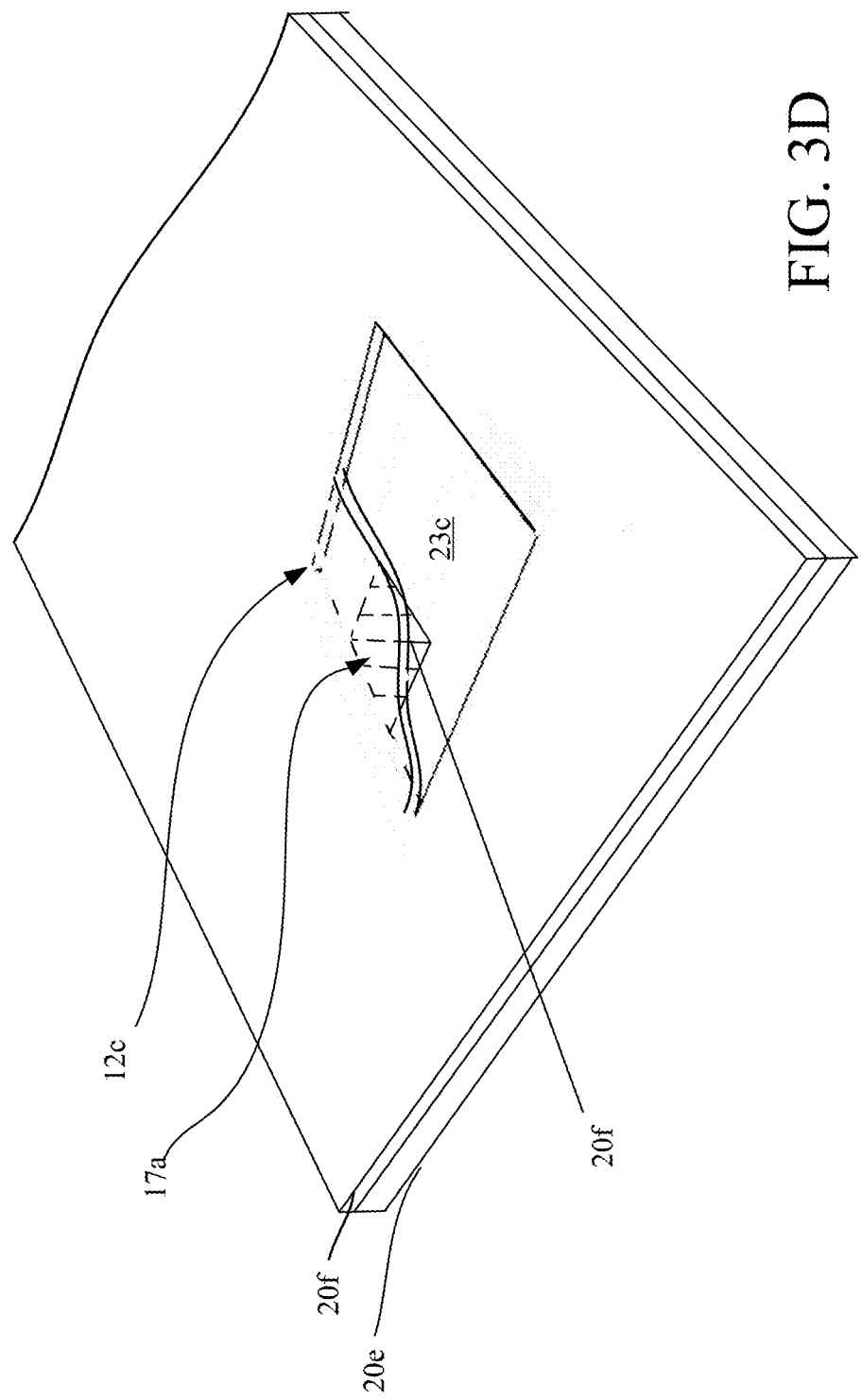

FIG. 3D shows the fifth layer 20e and the sixth layer 20f of the flexible circuit substrate 20. The fifth layer 20e is a spacer layer having a compartment 23c and the sixth layer carries the electrode 17a. The fifth layer 20e defines a portion 12c of the frame 12 (FIG. 1). The sixth layer 20f is a layer of a flexible material having a metalized surface layer 20f' on a surface thereof from which the electrode 17a is patterned. The compartment 23c is formed in the fifth layer 20e also of the flexible material of the flexible circuit substrate 20. (In FIG. 3D all of the metal layer 20f' is shown as removed, except on the electrode 17a, but conductors not shown could be patterned from the layer 20f'.) Compartments 23a-23c and frame portions 12a-12c provide respectively compartment 14 and frame 12 of the micro-accelerometer sensor element 10 (FIG. 1).

Referring to FIGS. 4A-4D, alternative configurations of beams 13 (FIG. 1) for the micro-accelerometer sensor element 10 are shown. Each of these configurations would include pairs or set of electrodes above and below the beams, similar in pattern to the beam 13a, 13b using principles discussed above.

Figure 4A:
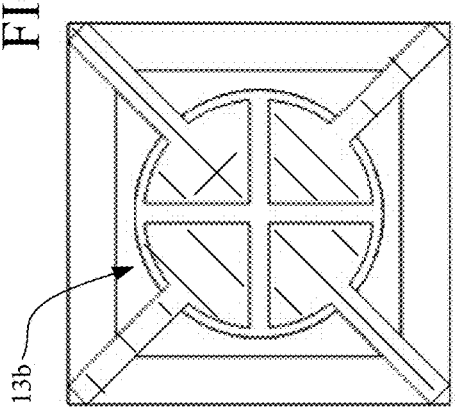
FIGS. 4A-4D are plan views of an alternative configurations of beams with corresponding electrode patterns.

FIG. 4A shows a torsional beam 13a that has an electrode (not referenced), and which beam is susceptible to bending and thus could detect bending accelerations (e.g., rocking type movements).

Figure 4C:
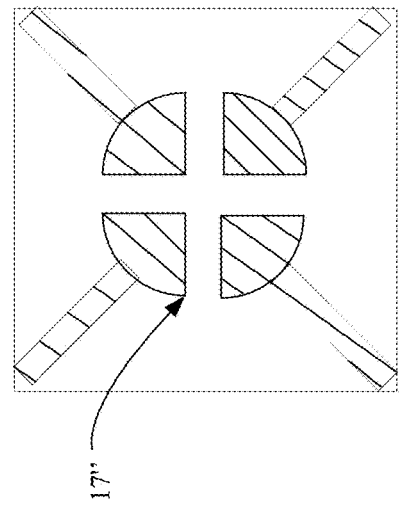
Figure 4B:
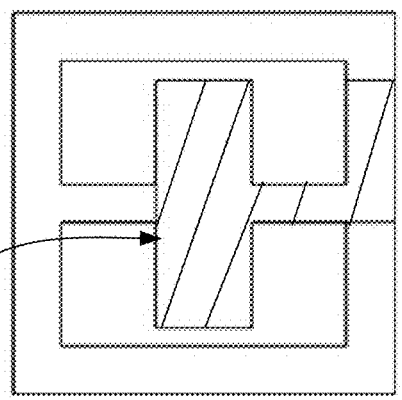

FIG. 4B shows corresponding electrodes (generally 17') that would be in alignment with the electrodes on the beam 13a and on layers (not shown) that were above and below the beam 13a of FIG. 4A. Capacitances are measured between each end region of the beam 13a and pairs of corresponding electrodes that are above and below the beam 13a.

FIG. 4C shows a beam 13b with four physically spaced electrodes (not referenced) that are electrically isolated from each other and that are suspended from four corners of a body that could detect accelerations in three dimensions, i.e., movement and orientation.

Figure 4D:
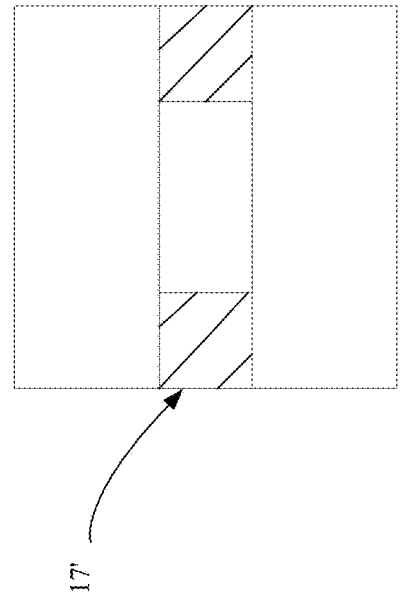

FIG. 4D shows corresponding electrodes (generally 17") and conductors (not referenced) that would be on layers (not shown) above and below the four physically spaced electrodes of the beam 13b of FIG. 13C. Capacitances would be measured between each of the four physically spaced electrodes and pairs of corresponding electrodes above and below the four physically spaced electrodes of the beam 13b.

Figure 5:
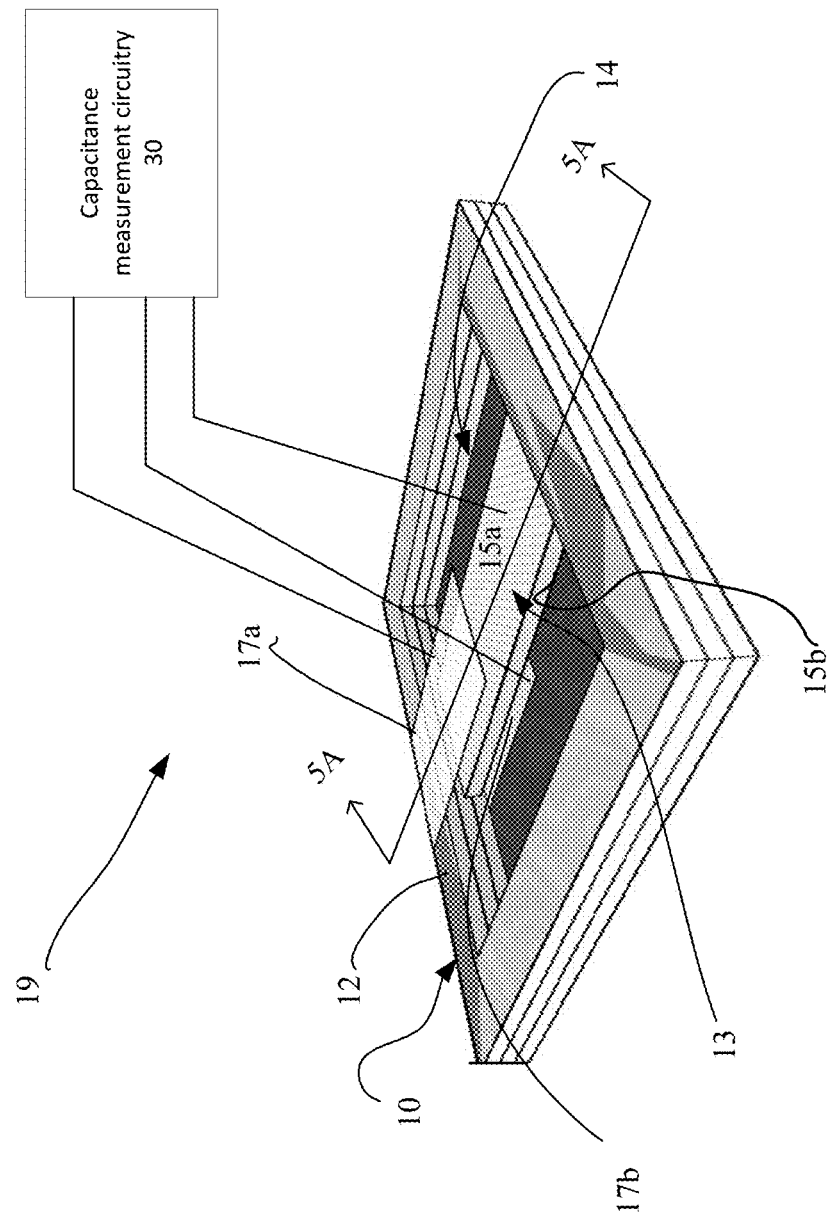
FIG. 5 is an isometric view of a micro-accelerometer system including the accelerometer sensor element device showing capacitance measurement circuitry.

Referring now to FIG. 5, a completed micro-accelerometer sensor element 10 (shown isolated, but understood to be fabricated as part of the describe flexible circuit) is coupled to capacitance measurement circuitry to provide a micro-accelerometer system 19. The cantilever beam 13 having electrodes 15a and 15b is spaced between electrodes 17a and 17b. The electrodes 15a, 15b and 17a, 17b are connected to a capacitance measurement circuit 30 that delivers voltages to the electrodes 15a-15b and 17a-17b according to the type of capacitance measurement circuit employed. In some examples of the micro-accelerometer system 19, the capacitance measurement circuit 30 uses an AC waveform and the capacitances are measured using frequency domain techniques. In other examples of the micro-accelerometer system 19, the capacitance measurement circuit 30 uses a DC waveform to measure capacitances using time domain techniques.

In some examples, the capacitance measurement circuits 30 are provided within the flexible circuit substrate 20. In other examples, the capacitance measurement circuits 30 can be very simple circuits and are provided on the flexible circuit substrate 20 after fabrication. In many instances, the capacitance measurement circuits 30 could be provided as part of the fabrication of the circuitry that the flexible circuit 11 carries and such capacitance measurement circuits would make the appropriate electrical contact to the device, e.g., the accelerometer.

Figure 5A:
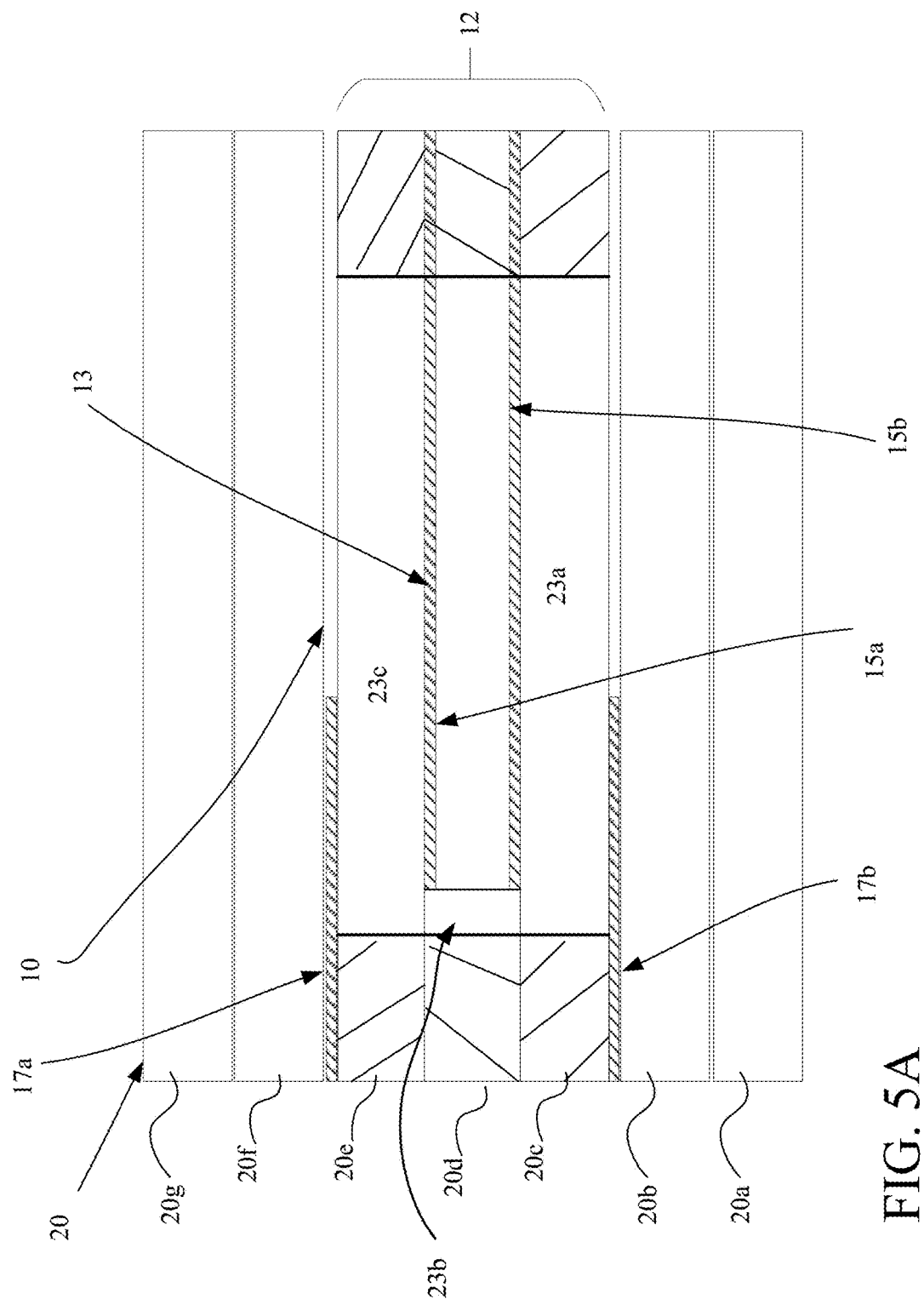
FIG. 5A is a cross-sectional view of the accelerometer sensor element device of FIG. 5, but not showing the capacitance measurement circuitry.

Referring to FIG. 5A, a cross-sectional view of a typical arrangement of a completed micro component, such as the accelerometer 10, is shown built between flexible circuit layers (20a and 20g) of the flexible circuit substrate 20. The accelerometer 10 is shown built from layers 20b-20f. Also shown on layers 20b, 20d and 20f are respective electrodes 17a, 15a, 15b (only one of electrodes 15a, 15b being needed, the other being optional), and electrode 17b. The respective electrodes 17a, 15a, 15b, and 17b were patterned from corresponding metal layers 20b, 20d', 20d" and 20f' (FIGS. 3A-3D). Thus, as also shown in FIG. 5A, the cantilever beam 13 is free to flex within the composite compartment 14 that is formed from the compartments 23a-23c defined by frame 12 (provided from frame portions 12a-12c shown in FIGS. 3A, 3B and 3D).

When the micro-accelerometer sensor element 10 is at rest the cantilever beam 13 is in a nominal position (generally centered between the electrodes 17a, 17b, but the centering may be offset by variations in thickness in the various layers that form the device 10. Nominal capacitances are measured between electrodes 15a, 17a (capacitance C1) and electrodes 15a, 17b (capacitance C2) in the embodiment where the beam only has one electrode. With the optional electrode 15b, nominal capacitances are measured between electrodes 15a, 17a (capacitance C1) and electrodes 15b, 17b (capacitance C2), in the embodiment where the beam two electrodes.

The electrodes 17a, 17b are essentially fixed in position by the layers 20b and 20e, whereas the cantilever beam 13 formed in layer 20c can flex due to an acceleration applied to the device 10. As the cantilever beam 13 flexes one of its electrodes 15a, 15b moves closer to one of the electrodes 17a, 17b, and concomitant therewith changes the position or distance between the one of the electrodes 15a, 15b and the electrodes 17a, 17b. These physical changes in the position of the electrodes 15a, 15b are manifested as changes in capacitance. These changes in distance separating the electrodes 17a, 17b and cantilever beam 13 cause changes in capacitance between electrode 17a and 15a as well as electrode 17b and 15b (or just electrode 15a if only one electrode is provided on the beam 13). The changes in capacitance are converted into a measure of acceleration (force).

A capacitance characteristic is provided by a pair of adjacent electrodes that are separated by a dielectric, e.g., dielectric property of the membrane (if provided) the dielectric of the beam, and air, and distances between the cantilever beam 13 and each of the electrodes 17a, 17b. Capacitance characteristics of such effective capacitors are determined from the overlay of the electrodes 15a, 15b (optional) and 17a, 17b, the dielectric and distance that separates the electrodes, e.g., generally at least approximated by a formula for a parallel plate capacitor, given as:

$$C = \varepsilon_r \varepsilon_0 A/d, \text{ where}$$

C is the capacitance, in farads;

A is the area of overlap of the two electrodes, in square meters;

$\varepsilon_r$ is the dielectric constant of the material between the electrodes (sum of dielectric constants of a membrane and fluid);

$\varepsilon_0$ is the electric constant ($\varepsilon_0 \approx 8.854 \times 10-12$ F·m−1); and d is the separation between the plates, in meters.

where d is sufficiently small with respect to A.

A controller (not shown) that is either part of the capacitance measurement circuit or a separate circuit references a table/algorithm to convert measured capacitance units into units of rates of change in velocity based on a characterization of the structure 10. Many techniques can be used to measure and detect changes in such capacitance over a nominal bulk capacitance provided by the micro-accelerometer sensor element 10 while in a rest condition and characterize these changes.

In some embodiments, the thicknesses of each of the layers 20b-20f is about 50 microns. Thus, the distances between the electrodes 17a and 15a on the cantilever beam 13 in its nominal positions is about 50 microns (thickness of spacer layer 20e). As an example, the micro-accelerometer sensor element 10 can have a length of about 1.5 mm, a width of about 1.5 mm, a total height (the cumulative height of different layers 20b-20f of 250 microns (0.25 mm). Other configurations are possible. Other thickness ranges are also possible. Generally, the thicknesses of each of the layers, as well as other layers that provide the flex circuit 20 can be of conventional thicknesses used for such circuit substrates, and more particularly between 25 microns and 250 microns per layer, and any sub-range within that range. In general, actual thickness would be application specific.

Compared to a conventional accelerometer used for similar purposes, the micro-accelerometer sensor element 10 may use less material, and thus is subject to less stress. The micro-accelerometer sensor element 10 has a size in the micron to millimeter scale and is built within the flex circuit substrate 20 as part of the fabrication of the flex circuit substrate 20, and can be fabricated during the fabrication of other elements, such patterned conductors that are used to form electrical interconnects. Other types of discrete devices may be inserted into the flex circuit substrate 20.

Characteristics

Body layers (layers)—The material used for the layers 20a-20g may be defined by the requirements of the flexible circuit and the device formed from those layers. In general, the material needs to be strong or stiff enough to hold its shape to produce the compartment. In some implementations, the material is etchable or photo sensitive so that its features can be defined and machined/developed. Sometimes it is also desirable that the material interact well, e.g., adheres, with the other materials in the sensor. Various thicknesses can be used for the layers, according to the application of the flexible circuit. Discussed herein is an exemplary thickness of 50 microns. However, the thicknesses of the layers can vary from microns to microns to millimeters to millimeters in thickness depending on the specific requirements of the flexible circuit 19.

Membrane (optional)—The membrane material is impermeable to the fluids of interest, including gas and liquids, is electrically non-conductive, and can have either a low or a high breakdown voltage characteristic. Examples of suitable materials include silicon nitride, PET, and Teflon. Others are possible.

Electrodes—The material of the electrodes is electrically conductive. Because the electrodes do not conduct significant amounts of current, the material can have a high electrical sheet resistance, although the high resistance feature is not necessarily desirable. The electrodes are subject to bending, and therefore, it is desirable that the material is supple to handle the bending without fatigue and failure. In addition, the electrode material and the membrane material adhere well, e.g., do not delaminate from each other, under the conditions of operation. Examples of suitable materials include very thin layers of gold and platinum. Others are possible.

Electrical interconnects—The voltages from the capacitance measurement circuits are conducted to the electrode on each membrane of each compartment. Electrically conducting paths to these electrodes can be built using conductive materials, e.g., gold and platinum and can be patterned from the metalized films.

Other materials—when MEMS processing is used in manufacturing the micro pressure sensor, a sacrificial filling material, e.g., polyvinyl alcohol (PVA), can be used. The sacrificial filling material may also be used in R2R processing. In some implementations, solvents are used in the manufacturing process, which may place additional requirements on the various materials of the micro accelerometer. It may be possible to print some of the electrical circuit components onto the membranes. In general, while certain materials have been specified above, other materials having similar properties to those mentioned could be used.

Other examples are possible. For example, the device 10 could be a pressure sensor 40.

Figure 6A:
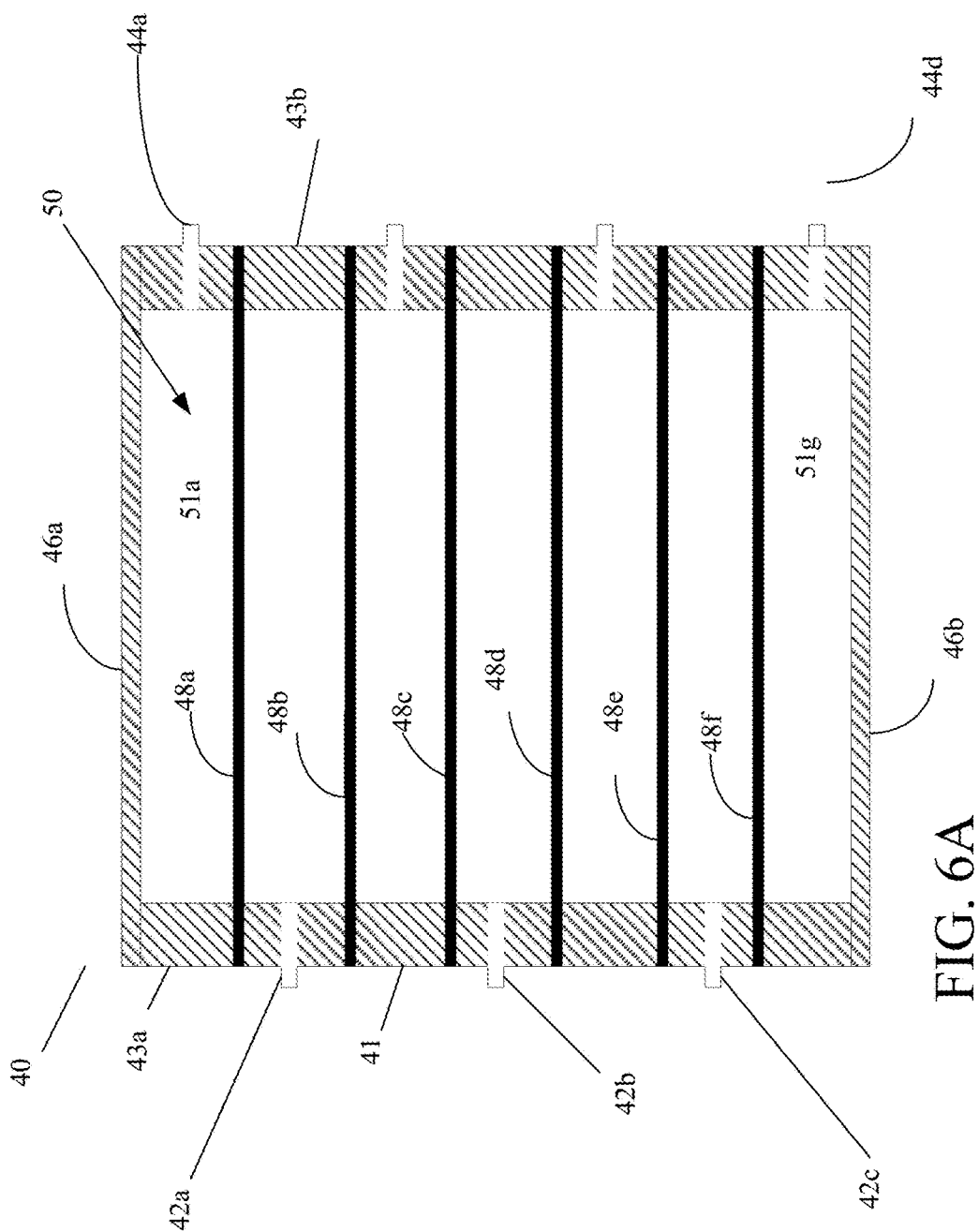
FIG. 6A is a cross-sectional view of a micro pressure sensor device fabricated as part of a flexible circuit substrate.
Figure 6B:
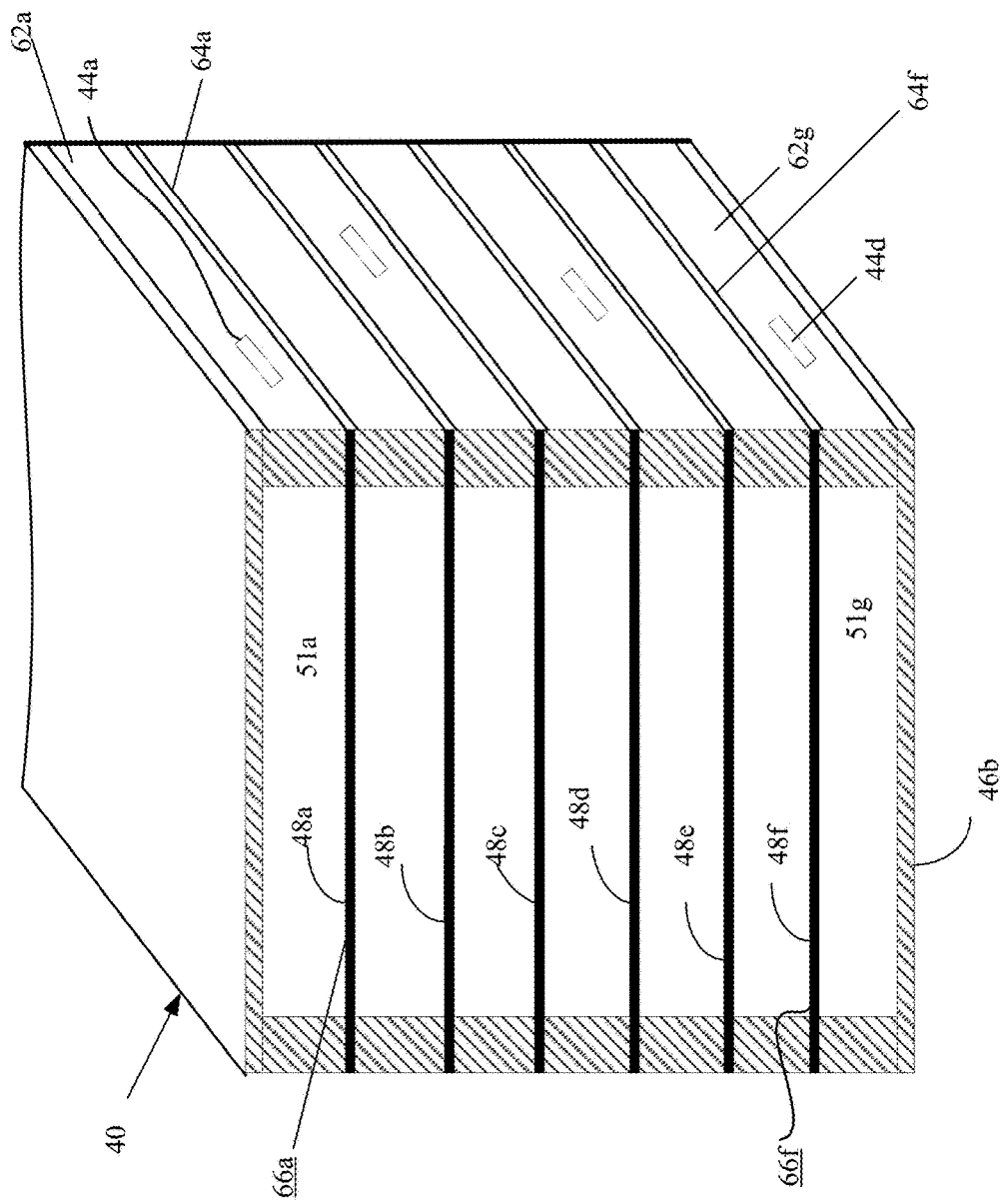
FIG. 6B is a perspective view of FIG. 6A.

Referring to FIGS. 6A and 6B, a micro pressure sensor 40 includes a single compartmentalized pressure sensor chamber 50. The micro pressure sensor 40 also includes a sensor body 41 having two walls 43a, 43b along a fluid flow direction and two walls, e.g. front and back walls (not shown in the views of FIGS. 1-4) that are orthogonal to two fixed end walls (i.e., end caps) 46a, 46b that are opposite to each other along a direction perpendicular to the fluid flow direction. The walls 43a, 43b and 46a, 46b and the front and back walls define the single chamber 50. The single chamber 50 is compartmentalized by membrane layers (membranes) 48a-48f. Membranes 48a-48f are anchored between the two end walls 46a, 46b and the front and back walls. The membranes 48a-48f extend from wall to wall separating the chamber 50 into plural compartments 51a-51g. A first set of ports 42a-42c are disposed through wall 43a for fluid access into each of compartments 51b, 51d and 51f, respectively. A second set of ports 14a-14d, are disposed through wall 43b for fluid access into each of compartments 51a, 51c, 51e and 51g, respectively. In this implementation, each compartment 41a-41b includes a port either from the first set of ports 42a-42c or from the second set of ports 44a-44d, but not both, defined in the respective walls. For example, the compartment 51a includes the port 44a in the wall 43b, whereas wall 43a in the region of compartment 51a is solid, without any opening.

The device 40 would present a single input port and output port to the first set of ports 42a-42c and the second set of ports 44a-44d, from/to different exterior environments. Details of a micro pressure sensor fabricated as an individual component is set out in U.S. patent application Ser. No. 15/668,837, filed Aug. 8, 2017 the entire contents of which are incorporated herein by reference.

In fabricating the micro pressure sensor 40 as part of the fabrication of a flex circuit substrate 60, the sensor body 41 is fabricated from module layers (as disclosed in the incorporated by reference patent FIGS. 4-7). The module layers would be comprised of layers of the flexible material 62a-62g that is patterned to provide the compartments 51a-51g and membrane layers 64a-64f having metalized surfaces 66a-66g on the membrane layers 64a-64f, which surfaces are patterned to provide the electrodes (not referenced) on the membranes 48a-48f. Ports 44a-44d are shown staggered.

Figure 7:
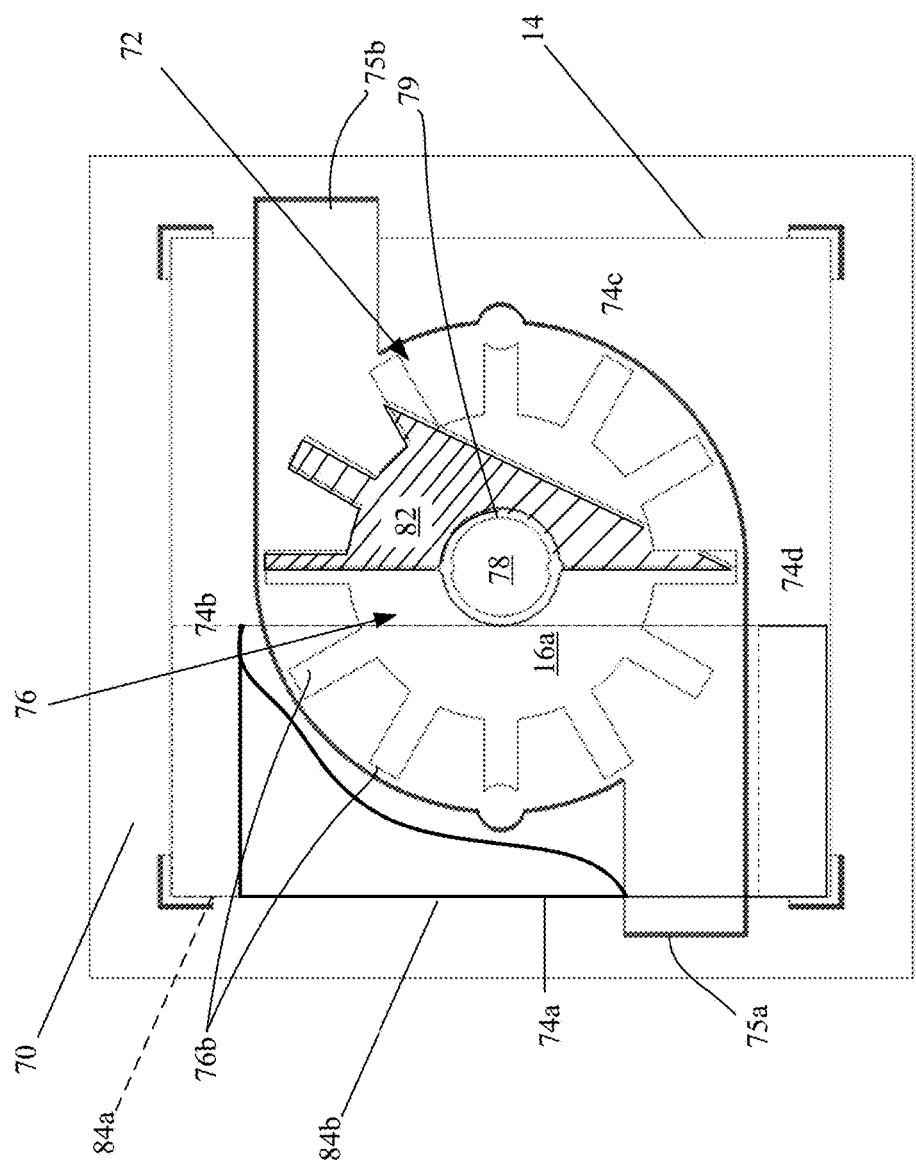
FIG. 7 is a plan view of a micro flow sensor device fabricated as part of a flexible circuit substrate.

Referring to FIG. 7, another example of a device fabricated from a flex circuit substrate is a micro flow sensor 70, shown in a final stage of construction (but with membranes (not referenced) and electrodes 84a, 84b on top and bottom surfaces of the device, shown by a dotted line and partially broken away, respectively for clarity). The micro flow sensor 70 has a single circular flow sensor chamber 72 defined by walls 74a-74d, ports 75a, 75b and a wheel 76 that is rotatable about a fixed axle 78. Bridge members (not shown) were used to tether the wheel 76 to a flow sensor body 74 during fabrication, and another set of bridge members (not shown) were used to tether the axle 78 to the wheel 76 during fabrication. With the bridges removed, the wheel 76 is free to rotate about the fixed axle 78. The wheel 76 has paddles 76b and an interrupter feature 82 (asymmetric metal layer on the wheel (other types of interrupters could be used). Details of a micro pressure sensor fabricated as a component are set out in U.S. Patent App. 62/541,128, filed Aug. 4, 2017 the entire contents of which are incorporated herein by reference.

A capacitance measurement circuit (not shown, but similar in concept to that used for the micro accelerometer 10) is attached to electrodes of the micro flow sensor 70. The capacitance measurement circuit delivers voltages to the electrodes according to the type of capacitance measurement circuit employed. In some examples of a capacitance measurement circuit an AC waveform can be used and the capacitance is measured using frequency domain techniques. In other examples of a capacitance measurement circuit a DC waveform is used to measure capacitance using time domain techniques. The capacitance measurement circuit delivers an output train of pulses that is proportional to the capacitance measured. A controller (not shown) converts these pulses to a capacitance value that is translated to a flow rate and flow direction. The output will be a value that represents the bulk capacitance between the electrodes 84a, 84b, which is modulated by the rotation of the wheel 76 and the metal layer 82 cutting into and out of a region of overlap with the electrodes 84a, 84b.

Referring now to FIGS. 8A and 8B, various ones of the layers used in construction of the respective devices of FIGS. 6A, 6B and 7 are also layers used for fabrication of the flexible circuit 11 from the flexible circuit substrate 20. For fluid ingress and egress devices (e.g., the device 40 or the device 70 of FIGS. 6A and 7), these devices could present ports 85a, 85b, e.g., a single input port 85a and a single output port 85b from/to different exterior environments for fluid flows into and out of the devices (40, 70) via slots 87a, 87b. In addition, in some implementations surface mounted inlets 85a and outlets 85b would be provided on other layers of the flexible circuit 11 to connect the device 40 or the device 70 from/to the different exterior environments.

Processing for Producing Micro-Accelerometer Sensor Elements

Referring to FIG. 9, aspects of processing 90 a flexible circuit substrate 20 to produce an embedded device from the layers of the flexible circuit substrate 20, as such flexible circuit 11 is being constructed are shown. In FIG. 9, discussed are details of fabrication of the micro-accelerometer sensor element 10 as illustrative example.

Initially, the layer 20a is provided 91 from a sheet (not shown) of material. In some embodiments 20a can be part of an initial layer of the embedded device.

A layer 20b of a flexible material 50 micron thick sheet (not shown) of material having a metalized 100 Angstrom thick surface layer is provided over layer 20a. The sheet of material for layer 20b will be patterned to carry the electrode 17b. For the particular implementation the material of layer 20b is polyethylene terephthalate (PET). Other materials could be used. The metalized 100 Angstrom thick surface layer of Al is patterned 92 to provide the electrode 17b and conductors or conductive contacts to the electrode 17b, as needed. A direct write or a mask is used to configure a laser ablation station to remove the metal from areas of the layer 20b.

The layer 20c such as a non-metalized 50 micron thick sheet (not shown) of flexible material is patterned 94 to form compartment 23a in the micro-accelerometer sensor element 10 by micro-machining using a mask (not shown) or direct write to configure a laser ablation station to define or form the compartment 23a, as discussed in FIG. 5A. Vias are also provided for electrical connections (not shown). The micro-machining ablates away the flexible plastic material to form the compartment 23a.

The layer 20d of flexible material such as a single sided or dual sided metalized 50 micron thick sheet (not shown) is patterned 96 to form one or two electrodes 15a, 15b, by clearing the metal layer(s) from all regions of the sheet other than regions of the embedded device, such as the micro-accelerometer sensor element 10, which regions will correspond to conductors, e.g., the electrodes 15a, 15b (FIG. 3B) on the cantilever beam 13 and a portion of the body layer (and other conductors if the layer is an active involved with other features/devices of the flex circuit substrate 20). Also, while not shown, the metal layer 42a may also be patterned to provide conductors or conductive contacts to the electrodes 15a (and 15b).

The layer 20d is provided by micro-machining 98 the sheet, using a mask (not shown) or direct write to configure a laser ablation station to define or form the compartment 23b and the cantilever beam 13. Vias are also provided for electrical connections. The micro-machining ablates away the material of the sheet that provides layer 20d to form the compartment 23b that is part of the compartment 14 in the layer 20d, and provide the cantilever beam 13 (FIG. 3B).

The layer 20e such as a non-metalized 50 micron thick sheet (not shown) of flexible material is patterned 100 to form compartment 23c in the micro-accelerometer sensor element 10 by micro-machining using a mask (not shown) or direct write to configure a laser ablation station to define or form the compartment 23c as discussed in FIG. 5A. Vias are also provided for electrical connections (not shown). The micro-machining ablates away the flexible plastic material to form the compartment 23c.

The layer 20f of material is provided from a 50 micron thick sheet (not shown) that has a metalized 100 Angstrom thick surface layer that will carry the electrode 17a. For the particular implementation the material of layer 20f is polyethylene terephthalate (PET). Other materials could be used. The metalized 100 Angstrom thick surface layer of Al is patterned 102 to provide the electrode 17a and conductors or conductive contacts to the electrode 17a, as needed. A mask (not shown) or direct write is used to configure a laser ablation station to remove the metal from areas of the layer 20*f*.

Cap layers or other layers, e.g., the layer 20*a* and the layer 20*g* are provided from sheets (not shown) of a flexible material are provided 104 over the now completed device 10.

Layers 20*a*-20*g* can be metalized (or non-metalized as needed) 50 micron thick layers having (as needed) a 100 Angstrom thick surface layer of a metal e.g., Al. For the particular implementation above, the material is polyethylene terephthalate (PET). Other materials could be used.

All layers of the flex-circuit substrate 20 including the layers 20*a*-20*g* are laminated 104 together using conventional flex circuit substrate fabrication techniques. Each of the layers 20*a*-20*g* are machined to provide alignment holes (not shown). The layers 20*a*-20*g* are laminated together to form the embedded device, such as the micro-accelerometer sensor element 10, fabricated as part of fabrication of the flexible circuit 11. For other devices, such as the pressure sensor 40, the fabrication steps will vary, depending on the nature of the device.

In general, such devices will have some fabrication features in common. These devices are micro-electro-mechanical (MEMS) devices formed within the flex circuit substrate, by being formed from the layers that provide the flex circuit substrate. At least some of the layers are patterned to form one or more apertures or compartments in the respective layers. At least some of the layers are patterned to form electrodes on the respective layers. In some examples of these devices, membrane layers are used to support electrodes (e.g., some examples of the accelerometer 10, the pressure sensor 40 and the flow sensor 70). In some examples, the membrane layers themselves are expected to flex (e.g., the pressure sensor 40) or elements are expected to move or rotate (e.g., the wheel in the flow sensor 70). In general, pairs of such electrodes are disposed in a functional relationship with a dielectric to provide capacitors, whose capacitances are measured to provide an indication of the performance of the device. The micro-electro-mechanical (MEMS) devices fabricated as part of the flex circuit substrate perform specific functions, such measuring of physical properties or performing a mechanical action, etc.

The layers 20*a*-20*g* can also be laminated between a pair of prefabricated sealing layers disposed on both sides of the layers. The sealing layers can be 50 micron layers. The prefabricated sealing layers are patterned to cut electrode access notches for electrical connections or vias. In other techniques, each of the layers 20*a*-20*g* are processed to cut alignment pin holes (not shown) that are used to position the layers 20*a*-20*g* in a fixture and cut stitches that are used to singulate micro-accelerometer sensor element 10 from layer arrays.

The above technique can also use a machine vision system to produce a data file that is used by the laser ablation system in aligning a laser ablation station with a mask (or direct write) such that a laser beam from the laser ablation system provides features according to the mask used in registration with the corresponding portions of the bodies, as discussed. The electrodes are formed by ablating away the metal in regions that are not part of the electrodes and conductors, leaving isolated electrodes and conductors on the layer.

The layers 20*a*-20*g* of flexible material can be polyethylene terephthalate (PET). Other materials could be used. In some implementations, some thinning of features to accommodate variations in thicknesses among the various layers or to accommodate features of particular devices may be performed. The processing line can comprises several stations, (not shown) and in general can use otherwise conventional flexible circuitry fabrication techniques, as otherwise modified as discussed herein.

Processing viewed at a high level thus can be additive (adding material exactly where wanted) or subtractive (removing material in places where not wanted). Deposition processing includes evaporation, sputtering, and/or chemical vapor deposition (CVD), as needed, as well as printing. The patterning processing can include depending on requirements techniques such as scanning laser and electron beam pattern generation, machining, optical lithography, mask and flexographic (offset) printing depending on resolution of features being patterned. Ink jet printing and screen printing can be used to put down functional materials such as conductors. Other techniques such as punching, imprinting and embossing can be used.

In some embodiments, roll to roll processing can be used to fabricate the micro-electro-mechanical (MEMS) devices, such as the micro-accelerometer sensor element 10. These techniques can use a web of flexible material can be any such material and is typically glass or a plastic or a stainless steel. While any of these materials (or others) could be used, types of plastics have advantages of lower cost considerations over glass and stainless steel. Specific materials will be determined according to the application of the micro-accelerometer sensor element 10 (or the other devices). In high temperature applications materials such as stainless steel or other materials that can withstand encountered temperatures would be used, such as Teflon and other plastics that can withstand the encountered temperatures.

For the structures shown in FIGS. 1-8B, stations within a roll to roll processing line are set up according to the processing required. Thus, while the end cap and top caps could be formed on the web or plastic sheet in one implementation the end and top caps are provided after formation of the micro-accelerometer sensor element 10.

In some implementations, the plastic web is used to support the body by a deposition of material on the web at a deposition station followed by patterning station. The body is formed at a forming station. The web having the body has a membrane deposited over the body at a station. An alternative roll to roll processing approach to provide the micro-accelerometer sensor element 10 has the raw sheet (or multiple raw sheets) of material passed through plural stations to have features applied to the sheet (or sheets) and the sheet (or sheets) are subsequently taken up to form parts of the repeatable composite layers to ultimately produce a composite sheet of fabricated micro-accelerometer sensor element 10.

Via conductors are used to interconnect the patterned electrodes on micro-accelerometer sensor element 10. The via conductors are castellated structures, i.e., with relatively wide areas contacting electrode tabs and relatively narrow areas through holes in the electrode. This arrangement is provided by having the holes in the body portions larger than the holes through the electrode portions. This can be accomplished during the patterning stages of the body and the electrodes respectively. The via conductors are formed by introduction of the conductive inks mentioned above into the holes.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

Other embodiments are within the scope of the following claims. For example, in some implementations, three layers could be used to provide the micro accelerometer. A first layer would have a compartment on the bottom of which would be the first electrode, a second layer would have a compartment that supports within the compartment the cantilever beam carrying the beam electrode, and a third layer would have a compartment on the bottom of which would be the second electrode. This could avoid the need for the spacer layers, as shown in FIG. 5A.

Other modifications include using the principles described herein to provide hybrid constructed circuit substrates on rigid (so called rigid-flex circuits) and semi-rigid circuit substrates, in addition to flexible circuit substrates. Excluded are single crystalline semiconductor substrates. Thus, suitable materials include polyester (PET), polyimide (PI), polyethylene naphthalate (PEN), polyetherimide (PEI), various types of fluropolymers (FEP) and copolymers, in addition to other materials commonly used for rigid, semi-rigid circuit and flexible circuit substrates. In some embodiments adhesives are used as a bonding medium to laminate layers together. Adhesive can be of various polymer materials such as thermoplastic polyimide adhesives. Both base layers and adhesive layers can be of many different thickness that is typically governed by the specific use of the flex or semi-flex or rigid circuit substrate.

What is claimed is:

1. A circuit substrate comprises:
   a plurality of layers of one or more materials, with the plurality of layers adhered together, and with at least a first set of the plurality of layers having patterned electrical conductors thereon; and
   a micro electro mechanical device disposed within the circuit substrate, and integrally formed from a second set of the plurality of layers.

2. The circuit substrate of claim 1 wherein at least some of the plurality of layers of the material are layers comprising one or more of a rigid or a semi-rigid or a flexible material, which layers are adhered by being laminated.

3. The circuit substrate of claim 1 wherein at least some of the plurality of layers of the material are layers comprising a flexible material to provide the circuit substrate as a flex-circuit substrate.

4. The circuit substrate of claim 1 wherein the patterned electrical conductors are on at least some of the layers of the second set of the plurality of layers.

5. The circuit substrate of claim 1 wherein at least some of the second set of layers of the plurality of layers have a compartment and at least some other layers of the second set of layers of the plurality of layers each have a metal conductor supported on portions of the some other layers.

6. The circuit substrate of claim 3 wherein at least some of the second set of layers of the plurality of layers of the flexible material have a compartment and at least one of the layers of the second set of the plurality of layers has a member integrally formed from the one layer, with the member being movable within the compartment.

7. The circuit substrate of claim 1 wherein the second set of layers of the plurality of layers comprise a flexible material, and the device is a micro-accelerometer sensor element.

8. The circuit substrate of claim 7 wherein the micro-accelerometer sensor element further comprises:
   a first electrode supported on a first layer of the second set of layers of the plurality of layers;
   a first spacer layer having a first compartment, the first spacer layer provided from a second layer of the second set of layers of the plurality of layers;
   a cantilever beam provided from a third layer of the second set of layers of the plurality of layers, the cantilever beam carrying a cantilever beam electrode;
   a second spacer layer having a second compartment, the second spacer layer provided from a fourth layer of the second set of layers of the plurality of layers; and
   a second electrode supported on a fifth layer of the second set of the plurality of layers, with the cantilever beam electrode being disposed in a vertical alignment between the first and second compartments, and between portions of the first and second electrodes.

9. The circuit substrate of claim 8 further comprising:
   a capacitance measurement circuit having a first pair of inputs coupled to the first electrode and the beam electrode and a second pair of inputs coupled to the second electrode and the beam electrode; and
   a controller that converts measured capacitance from the capacitance measurement circuit into a measure of acceleration.

10. The substrate circuit of claim 1 wherein the second set of the plurality of layers of the material are layers comprising a flexible material, and the device is a micro flow sensor, with a subset of the second set of the plurality of layers of the flexible material having one or more compartments formed in portions of the subset of the second set of the plurality of layers of the flexible material and with a rotatable wheel provided from a first layer of the subset of the second set of the plurality of layers of the flexible material and supported within the compartment between second and third layers of the subset of the second set of the plurality of layers of the flexible material.

11. The substrate of claim 1 wherein the second set of the plurality of layers comprise a flexible material that support a membrane layer, the device is a micro pressure sensor, and with a subset of the second set layers having compartments in portions thereof, with portions of the membrane layer supported over the compartments, and with each compartment having either an input or an output port.

12. A method comprising:
   forming of a circuit substrate from a plurality of layers of one or more materials and with at least a first set of the plurality of layers having patterned electrical conductors formed thereon; and while forming the circuit substrate,
   integrally forming an operative, micro electro mechanical device within the circuit substrate among a second set of the layers of the plurality of layers of the one or more materials.

13. The method of claim 12, wherein the circuit substrate is one of a flexible circuit substrate, a rigid or a semi-rigid substrate, with the method further comprising:
   patterning a metal layer on a first layer from the set of layers to provide an electrode; and wherein adhering comprises laminating together the layers of the one or more materials.

14. The method of claim 12, further comprising;
   forming a compartment in a first layer from the set of layers.

15. The method of claim 12, further comprising:
   patterning a metal layer on a first layer from the set of layers to provide a first electrode;
   forming from a second layer from the set of layers, a moveable member that is moveable within the compartment; and patterning a metal layer on a third layer from the set of layers to provide a second electrode.

16. The method of claim 12 wherein the first electrode is in vertical alignment with the second electrode and functionally associated with the member that moves within the compartment.

17. The method of claim 16 wherein the operative device is a micro-accelerometer sensor element and the member that moves is a beam.

18. The method of claim 16 wherein the operative device is a micro-flow sensor and the member that moves is a rotatable wheel.

19. The method of claim 13, wherein the operative, micro electro mechanical device is a micro pressure sensor, the method further comprising:
  forming a plurality of repeatable layers, by
    patterning first layers to provide corresponding compartments; and
    patterning metal layers on a like number of membrane layers to provide patterned electrodes, with the electrodes on the membrane layers disposed over respective compartments in the first layers; and
  stacking the plurality of repeatable layers.

20. The method of claim 19, further comprising:
  providing a capacitance measurement circuit having a first pair of inputs coupled to the first electrode and the beam electrode and a second pair of inputs coupled to the second electrode and the beam electrode; and
  providing a controller that converts measured capacitance from the capacitance measurement circuit into a measure of acceleration.

21. A micro-accelerometer sensor element device, formed by a process comprising:
  forming the micro-accelerometer sensor element device within a flexible circuit substrate, while forming the flexible circuit substrate from a plurality of layers of a flexible material, by:
    patterning a metal layer that is on a first one of the plurality of layers of flexible material to provide a first electrode;
    patterning at least one metal layer that is on a second one of the plurality of layers of flexible material to provide a cantilever beam electrode;
    forming from the second one of the plurality of layers of flexible material, a compartment and a cantilever beam that supports the cantilever beam electrode, with the cantilever beam electrode having a portion thereof in a vertical alignment with a portion of the first electrode; and
    patterning a metal layer that is on a third one of the plurality of layers of flexible material to provide a second electrode, with the second electrode in vertical alignment with the first electrode and the cantilever beam electrode.

22. A method of providing an operative device embedded within a flexible circuit substrate comprised of a plurality of layers of a flexible material, the method comprising,
  patterning a metal layer that is on a first one of the plurality of layers of flexible material to provide a first electrode;
  patterning at least one metal layer that is on a second one of the plurality of layers of flexible material to provide a cantilever beam electrode;
  forming from the second one of the plurality of layers of flexible material, a compartment and a cantilever beam that supports the cantilever beam electrode, with the cantilever beam electrode having a portion thereof in a vertical alignment with a portion of the first electrode; and
  patterning a metal layer that is on a third one of the plurality of layers of flexible material to provide a second electrode, with the second electrode in vertical alignment with the first electrode and the cantilever beam electrode.

23. The method of claim 22 wherein the operative device is a micro-accelerometer sensor element.

24. The method of claim 22, further comprising:
  forming a first spacer layer between the first and second layers; and
  forming a second spacer layer between the second and third layers, and with the first and second spacer layers each having a compartment over which the respective first and second electrodes are supported.

* * * * *